United States Patent [19]
Hashimoto et al.

[11] Patent Number: 5,326,316
[45] Date of Patent: Jul. 5, 1994

[54] COUPLING TYPE CLEAN SPACE APPARATUS

[75] Inventors: Naoyuki Hashimoto; Sakae Kobayashi, both of Hirakata; Youichi Nakamura, Katano, all of Japan

[73] Assignee: Matsushita Electric Industrial Co., Ltd., Osaka, Japan

[21] Appl. No.: 869,741

[22] Filed: Apr. 16, 1992

[30] Foreign Application Priority Data

Apr. 17, 1991 [JP] Japan ................................ 3-85094

[51] Int. Cl.⁵ ............................................ F24F 3/16
[52] U.S. Cl. ................................... 454/187; 55/385.2
[58] Field of Search .............. 454/44, 56, 57, 187; 55/385.2

[56] References Cited

U.S. PATENT DOCUMENTS

| | | | |
|---|---|---|---|
| 3,782,265 | 1/1974 | Pielkenrood et al. | 454/187 |
| 4,723,480 | 2/1988 | Yagi et al. | 454/187 X |
| 4,923,352 | 5/1990 | Tamura et al. | 454/251 X |
| 4,963,069 | 10/1990 | Wursy et al. | 454/187 |

FOREIGN PATENT DOCUMENTS

| | | | |
|---|---|---|---|
| 213754 | 10/1985 | Japan | 454/187 |
| 24933 | 2/1986 | Japan | 454/187 |
| 1-171646 | 7/1989 | Japan | . |

OTHER PUBLICATIONS

E. E. Howard, "Local Air-Conditioning and Humidity Control of Clean Air Hoods", *IBM Technical Disclosure Bulletin,* vol. 19, No. 10, IBM Corp., Mar. 1977, pp. 3850 and 3851.

*Primary Examiner*—Harold Joyce
*Attorney, Agent, or Firm*—Ratner & Prestia

[57] ABSTRACT

A clean space having a desired total volume is formed by coupling unit room bodies in sequence. Alterations in the configuration of clarifying and air-conditioning facilities are carried out easily and quickly, even if the structure and disposition of the clean space are altered. Each of the unit room bodies includes an air-circulator such as a fan unit and a dust catcher such as an air-filter. Each of the unit room bodies also includes an air conditioner-setting space shut off from the clean space in the interior of the unit room body.

7 Claims, 11 Drawing Sheets

COUPLING TYPE CLEAN SPACE APPARATUS

BACKGROUND OF THE INVENTION

The present invention relates to a coupling type clean space apparatus. More precisely, clean space apparatuses are used for making a clean space of almost no dust pollution and the like, that is a so-called clean space, to carry out various types of processes and operations which should not be carried out in a dust filled environment. The present invention relates to a coupling type clean space apparatus which easily makes a clean space route of an optional size by coupling unit room bodies having specific interior volumes in sequence.

In a production line to carry out production of semiconductor apparatuses and other ultraprecise articles, if minute dust is present in the air, the quality and capability of produced articles are affected very badly. Therefore, in a production line of this kind, the various types of processes and operations are carried out in a so-called clean room, from which the dust in the air has been eliminated at a high standard.

In a common production line, accompanied with alteration in the kind of articles and the production process, an alteration in arrangement of the production line or an addition to withdrawal from the production line are frequently carried out. If there is an alteration in the production line, the clean room is desirably rebuilt. However, it is extremely expensive to rebuild the whole clean room in all cases when the production line is slightly altered and also, to design, build and construct the clean room in all cases is time-consuming.

Therefore, a clean space having the necessary volume and shape to be arranged has been constructed by producing clean room units of specific interior volumes beforehand and then, coupling these clean room units in sequence. Doing this, even if there is an alteration in the production line, the arrangement of the clean room units is sufficiently adjustable, and an economical load and time loss accompanied with alteration in the production line is much reduced.

Practically, a continuous long clean space route is constructed by linearly and successively coupling clean room units of a tube type, which have opened ends in both terminals, and defined process and operation are carried out by transferring articles to be processed through this clean space route. A structure which exemplifies this type clean space apparatus has been disclosed in Japanese Official Patent Provisional Publication, 61-107735.

SUMMARY OF THE INVENTION

In a clean space which is made by coupling clean room units as mentioned above, an air-filter to catch dust in the air, an air-circulating fan to circulate a controlled air current, or an air-conditioner to control temperature and humidity and the like have been arranged collectively at one position or several positions in a terminal part etc. of the clean space. Accordingly, it was desirable to design the volume and capability of the air-circulating fan etc., considering the volume and shape of the whole clean space.

However, if cleaning and air-conditioning facilities of a proper volume are arranged considering the volume of the whole of the clean space, when there occurs an increase in the volume or an alteration in the arrangement of a clean space accompanied with alteration in the production line, it is necessary to redesign the cleaning and air-conditioning facilities and to renew those to the ones corresponding well with a new clean space. In the clean space, when an air current condition or a pressure distribution in the interior varies even slightly, there is the possibility that the air current locally stops or that a pollution-accumulating part is generated, so that it is necessary to design the capacity of the cleaning and air-conditioning facilities and others precisely. However, this is very troublesome. Also, to arrange the cleaning and air-conditioning facilities is very expensive and, if they are designed and made after an alteration in the production line being confirmed, there occures a problem that a long period of time is consumed before completion of the process and operation.

As described above, if a clean space is made by coupling the clean room units, an alteration in structure of the clean space itself can be carried out easily and effectively, but if an alteration of the forementioned cleaning facilities takes time and cost, the benefit of using clean room units is greatly reduced.

Accordingly, it is an object of the present invention to provide a coupling type space apparatus which is used for making a clean space of an optional shape by coupling clean room units and capable of easily and quickly performing an alteration in the cleaning and air-conditioning facilities.

In the coupling type space apparatus which makes a clean space having a specific volume as a whole by coupling unit room bodies in sequence, a coupling type clean space apparatus relating to the present apparatus and solving the forementioned subject comprises an air-circulator and a dust catcher in each of unit room bodies and, furthermore, it comprises a space to arrange an air-conditioner, which is shut off from the forementioned clean space, in each of unit room bodies.

Preferable unit room bodies are such as having a structure similar to that of a clean room unit in common coupling type clean space apparatuses, which are not only such as making a clean space of a tunnel or tube type by coupling unit room bodies of a tube type in sequence which have an area capable of performing various kinds of process and operation, but also such as being arranged so as to be capable of coupling unit room bodies of another box or a tube type along a direction vertically crossing with an axis direction of the forementioned tube type unit room bodies so that unit room bodies are coupled along a curving line or coupled by lengthwise and sideways diverging or joining.

An opening is arranged in the unit room bodies in order to penetrate an interior space in the coupled unit room bodies. This opening is arranged, for example, at both the terminals of the unit room bodies or, in addition to these terminals, arranged on the direction vertically crossing the unit room bodies. In the unit room bodies being arranged at the terminals of the whole clean space, a shelter wall etc. which closes the opening is arranged at an opening which is not used for coupling. Doing like this, one closed space is constructed in the whole of a clean space. However, at a place where articles to be processed in the interior is transported into the clean space or articles already processed is transported to an outside, a door capable of freely opening and closing is arranged.

In the unit room bodies, an air-circulator and a dust catcher are arranged. The air-circulator consists of a fan unit and others similar to that used for a usual clean space, and it causes a defined and controlled circulating air current. The capacity and disposition structure of the air-circulator may be designed so as to circulate the air properly in only an interior volume of the unit room bodies equipped with the air-circulator. The dust catcher is called an air-filter or a HEPA filter, etc. Although a dust catcher for a usual clean space is used, other kinds of dust catchers may be arranged. This dust catcher may have a volume or structure corresponding with one unit room body.

In the unit room bodies, a means for transporting articles to be processed, various kinds of apparatuses for processing, and other facilities necessary for carrying out operations in the clean space are arranged. The space, in which these articles to be processed and apparatuses for processing are arranged, is maintained as a clean space which does not include any dust and pollution by using a clarifying means consisting of the aforementioned dust catcher or air-circulator.

In the unit room bodies, a space to set an air-conditioner shut off from the aforementioned clean space is arranged. The air-conditioner is for adjusting and controlling the temperature and humidity in a defined range and, for this, an air-conditioner similar to that used for usual clean space is used. An air-conditioner practically used is a temperature-controlling apparatus such as a cooler consisting of a cooling coil, drain pan and refrigerating condenser or a heater as well as humidity-controlling apparatus such as a humidifier or a dehumidifier. A space to set an air-conditioner is such as having a size capable of setting the above-described air-conditioner. At a position such as around a floor of the unit room bodies, which does not disturb various kinds of process and operation, the air conditioner-setting space is arranged under a condition of being shut off by a partition wall from the clean space of the unit room bodies, in which the process and operation are carried out, so that dust and polluted air does not invade. The heat-exchange face to carry out heat-exchange between the air-conditioner and the clean space is exposed to the clean space. A ventilation to take the exterior air into an air-conditioner or to exhale air is arranged on an external wall of the unit room bodies in the air conditioner-setting space. Also, in the air conditioner-setting space, there may be arranged various kinds of apparatuses or openings to carry out overhaul and repair.

If an air-circulator and a dust catcher are arranged in each of unit room bodies constructing the coupling type clean space, each interior of the unit room bodies is clarified by the respective air-circulator and dust catcher. Therefore, even if any number of the unit room bodies is coupled, each of the unit room bodies is properly clarified by an air-circulator and a dust catcher having capacities very proper for the interior volume and structure. Even if the coupling number and coupling structure of the unit room bodies are altered, it is enough to arrange an air-circulator and a dust catcher having similar embodiments in each of the unit room bodies.

When an air conditioner-setting space, which is shut off from a clean space clarified by the aforementioned air-circulator and dust catcher, is arranged in each of the unit room bodies in order to carry out various kinds of processes and operations, it is possible to adjust and control the temperature and humidity of the unit room bodies properly by arranging the air-conditioner in the above-described space. Depending upon the construction of a producing line and the kind of process and operation being carried out in the clean space, since there is a case where the air-conditioner is necessary and a case where it is unnecessary, if the aforementioned air conditioner-setting space is arranged in the unit room bodies, whether the air-conditioner should be arranged or not is chosen according to necessity. That is, in a case where the air-conditioner becomes necessary in a specific unit room body by an alteration in structure of the clean space, the air-conditioner can be added simply and promptly without carrying out a design alteration or a rebuilding of the clean space or the unit room body.

If the air conditioner-setting space is shut off from the clean space, an invasion of the dust and pollution generating from the air-conditioner is not a concern. Also, even when the air-conditioner is not set, there is no dust invasion from the exterior surroundings into the clean space through the air conditioner-setting space.

According to the coupling type clean space apparatus relating to the present invention, as mentioned above, since an air-conditioner and a dust catcher are arranged in each of the unit room bodies constructing a clean space, even if there is an alteration in the coupling number and the arrangement of the unit room bodies, clean surroundings are always and properly realized in each of the unit room bodies.

As a result, in every case where the clean space structure is altered, time and costs by redesigning and newly producing an air-circulator etc. are unnecessary, and an alteration in a layout of the clean space can be carried out simply, quickly and economically.

Furthermore, since an air conditioner-setting space which has been shut off from a clean space to carry out various kinds of processes and operations is arranged in each of unit room bodies, an air-conditioner is, if necessary, simply arranged without a structural alteration of the unit room bodies. Also, under a condition in which an air conditioner is arranged, because it is possible to prevent invasion of dust generating from the air-conditioner etc. into a clean space, a degradation of the clean space is not a concern.

DESCRIPTION OF THE PREFERRED EMBODIMENTS

Example

A coupling type clean space apparatus in one example of this invention is hereinafter explained referring to the figures.

Figure 1:
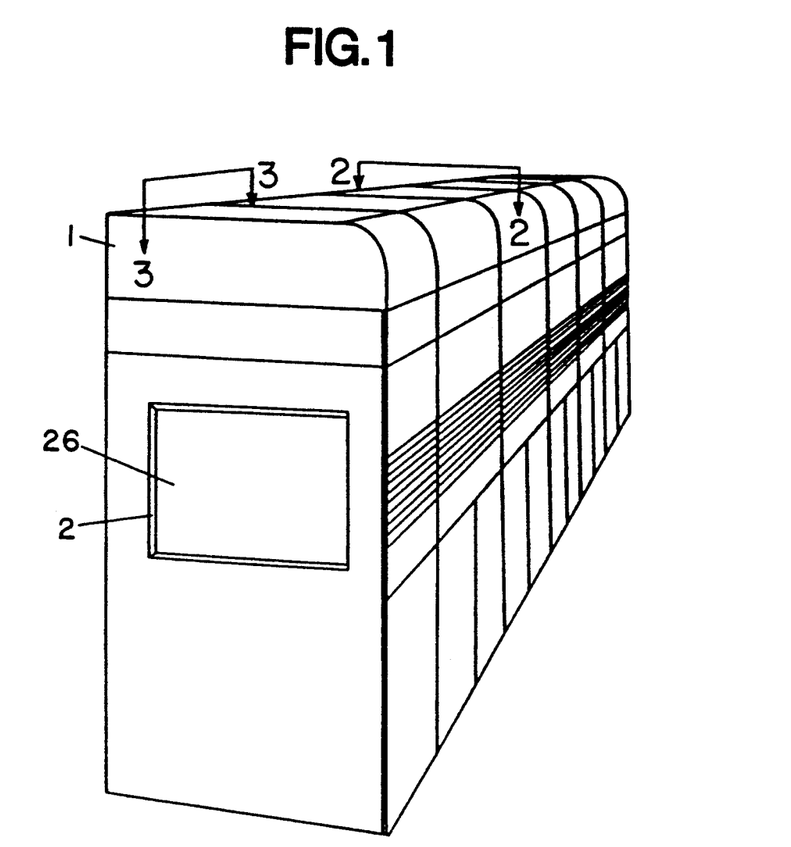
FIG. 1 shows a schematic perspective view of the external appearance of a unit room body.

A coupling type clean space apparatus is constructed by coupling the unit room bodies 1. FIG. 1 shows a schematic perspective view of the external appearance of the unit room bodies 1.

At both terminals of the unit room bodies 1, openings 2 are arranged to penetrate an interior space of the unit room bodies 1 to be coupled. In addition to those at both terminals of the unit room bodies 1, the opening 2 may be arranged in a direction vertically crossing with the aforementioned coupling direction and at a position different from both the terminals. In the unit room bodies 1 to be arranged, a shutter to close the opening 2 is set at the opening 2 which is not used for coupling. Doing this, the whole of the clean space constructs a tightly closed space.

Figure 2:
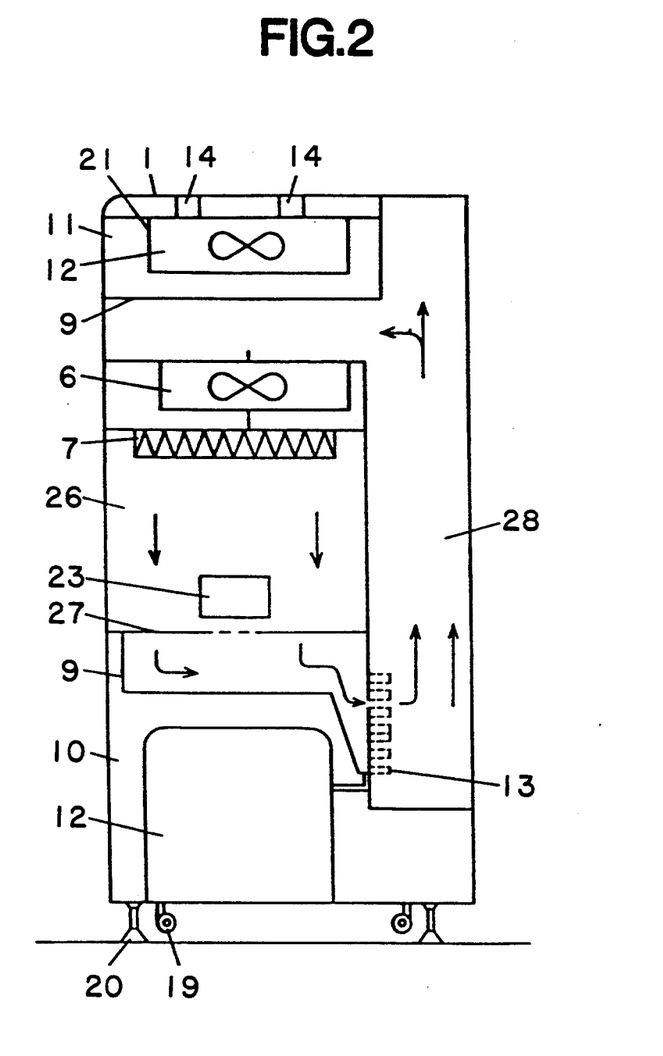
FIG. 2 is a cross-sectional view showing a 2—2 arrow-indicated section in FIG. 1.
Figure 3:
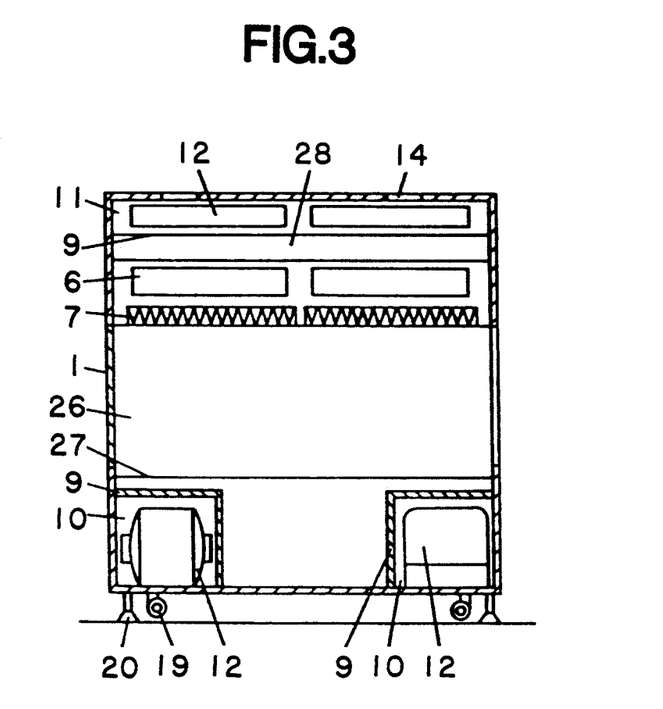
FIG. 3 is a cross-sectional view showing a 3—3 arrow-indicated section in FIG. 1.

FIGS. 2 and 3 are cross-sectional views showing the 2—2 and 3—3 arrow-indicated sections in FIG. 1, respectively. The figures show an air-circulator 6 and a dust catcher 7 arranged in each unit room body 1. The air-circulator 6 consists of a fan unit, which is similar to that used in a conventional clean space, to make a defined and controlled circulating air current in the unit room body 1, as indicated by an arrow-mark in an air current path 28. The capacity or structure for arrangement of this air-circulator 6 is designed so as to perform proper circulation of the air in only the interior volume of an unit room body equipped with an air-circulator. Concerning the dust catcher 7, although a dust-eliminating means for common clean space, which is called an air-filter or a HEPA filter, can be used, other various kinds of dust-eliminating means may be arranged. Also, this dust catcher 7 may have a volume or structure corresponding to one unit room body.

In the unit room body 1, in addition to a transporting means 23 for articles to be processed and various processing apparatuses, facilities necessary for working in a clean space are arranged. The processing space 26, in which the articles to be processed and processing apparatuses are arranged, is prepared so as to be capable of maintaining it at a clean space condition of no dust and no pollution by using a clarifying means, which consists of the dust catcher 7 and air-circulator 6. Also, a floor face of the processing space includes a duct 27. Furthermore, in the unit room body 1, there are arranged spaces 10 and 11 for setting air conditioners shut from the forementioned clean space by a partition wall 9. The spaces 10 and 11 have an approximate size to be able to set the air-conditioner 12, and they are arranged at positions such as around the floor of the unit room body 1 or around the ceiling of it, which do not disturb various processes and operations being carried out in the unit room body 1, and under a condition of being shut by the partition wall 9 from a clean space of the unit room body 1, in which the process and operation are carried out, so that dust and polluted air do not invade, and then, the air conditioner 12 is arranged in the spaces 10 and 11.

The air-conditioner 12 is to adjust and control the temperature and humidity in a defined range and, for this, an air-conditioner similar to that used for usual clean space is used. Practically, the air-conditioner 12 is a temperature-controlling apparatus such as a cooler consisting of a cooling coil, drain pan and refrigerating condenser or a heater as well as a humidity-controlling apparatus such as a humidifier or a dehumidifier. A heat-exchange face 13 to carry out heat-exchange between the air-conditioner 12 and the clean space is exposed to this clean space. A ventilation 14 to take the exterior air into the air-conditioner 12 or to exhale it is arranged on an exterior wall of the unit room body 1 in the air conditioner-setting spaces 10 and 11 and, as a means to exhale the interior air, an exhaling means 21 is arranged in the air conditioner-setting space 11. Meanwhile, the air-conditioner 12, heat-exchange face 13 and exhaling means 21 are one another connected by pipes and the like so as to maintain a thightly closed condition.

On an outside lower part of the unit room bodies 1, the casters for transportation 19 and the supporting feet for fixing 20 are set. In a condition shown in the figures, the unit room bodies 1 are supported by the supporting feet 20 and, since the casters 19 do not touch on the ground, the unit room bodies 1 are under a fixed condition. In a case where the clean space is under operation or altered in arrangement, if the casters 19 are allowed to touch on the ground by jumping up or shortening of the supporting feet 20, the unit room bodies 1 are able to move freely by the casters 19 under a supported condition, so that the unit room bodies 1 easily move.

Figure 4:
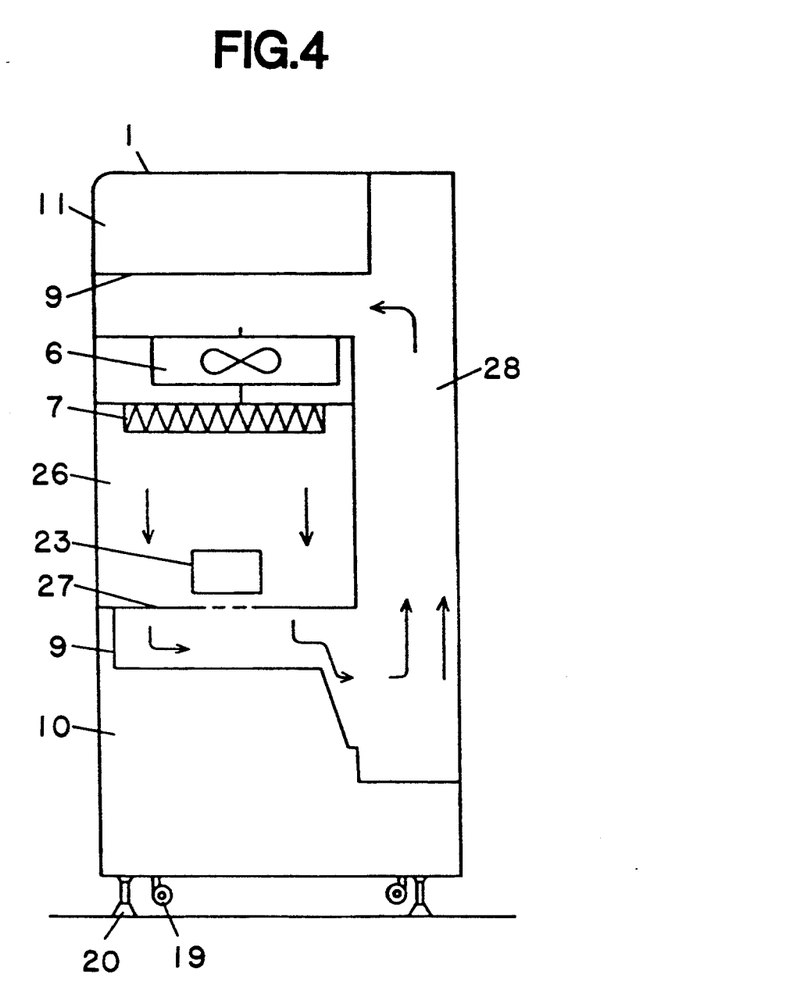
FIG. 4 sows a schematic perspective view of the external appearance of another unit room body.

Besides, the aforementioned unit room bodies 1 are equipped with the air-conditioners 12 in the spaces 10 and 11 which are fundamentally arranged in an interior of the unit room bodies 1. However, in the case of an unit room body 1 which does not need an air-conditioner depending upon the kinds of process and operation being carried out in a clean room, as shown in FIG. 4, the air-conditioner may not be arranged and, in addition, in a case where a space for the processing space 26 is desired to secure sufficiently and in an analogous case, the partition wall 9 forming the spaces 10 and 11 for setting air-conditioners may be removed.

Figure 5:
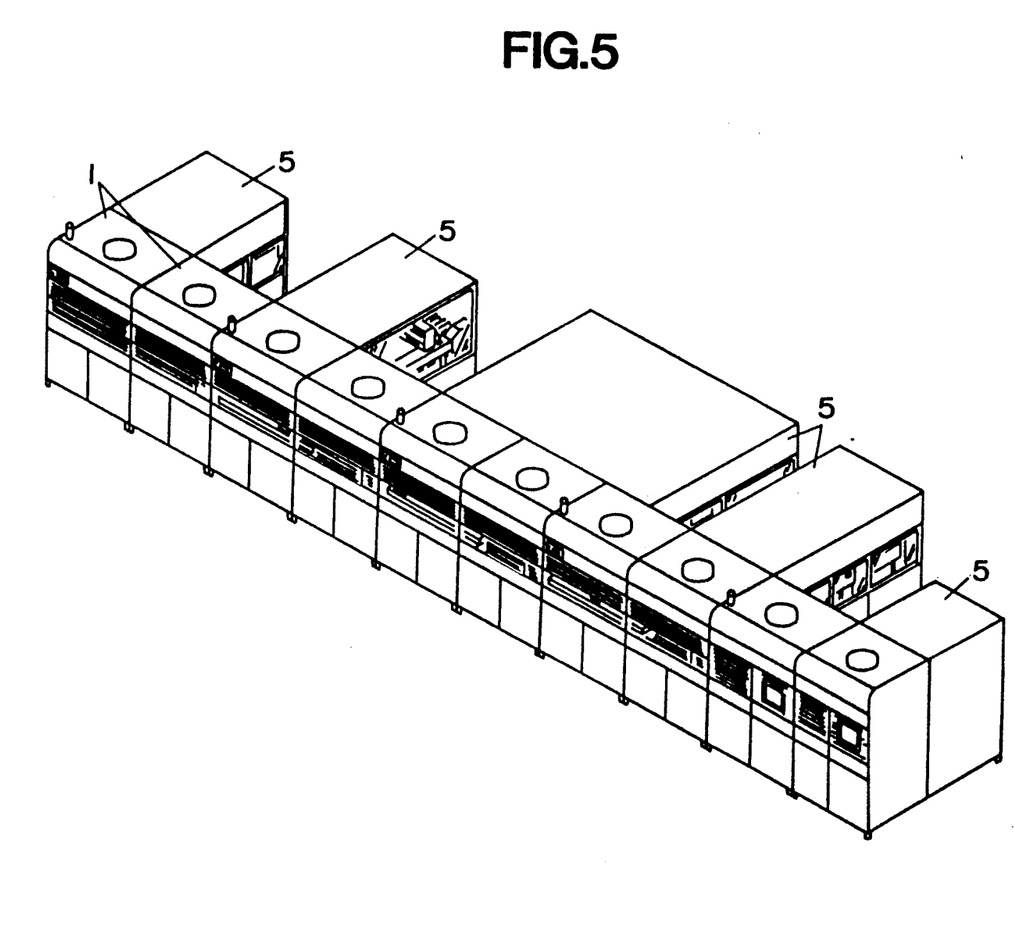
FIG. 5 shows an external appearance perspective view showing a coupling type clean space apparatus constructed by unit room bodies.

FIG. 5 shows an external appearance perspective view showing a coupling type clean space apparatus, which is constructed by the unit room bodies 1 having the above-described construction which are penetrated by the opening 2 and then, coupled on another. In the figure, unit room bodies 5, (hereinafter called unit room bodies for operation) of a kind different from the aforementioned unit room bodies 1 are coupled in a direction vertically crossing with a straight line type clean space route which has been made by penetrating the openings 2 arranged at both terminals of each of the unit room bodies 1 by coupling these bodies.

This is because it can be assumed that relatively large processing facilities may be necessary depending upon a process being carried out in the processing space 26, and because there can be assumed that an article to be processed is once taken out and is processed with various operations.

Figure 6:
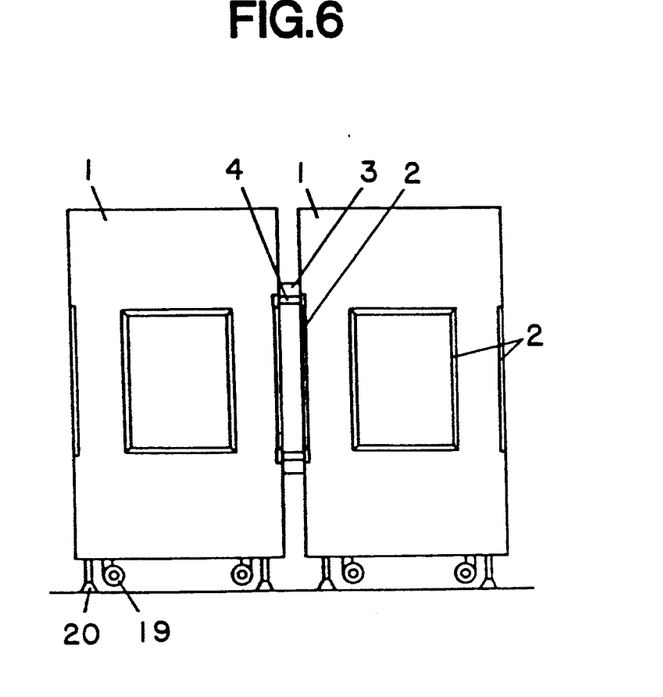
FIG. 6 shows an external appearance view showing a coupling between a unit room body and a unit room body for operation.

Coupling between the unit room body 1 and the unit room body for operation 5 is carried out by the fixing parts 4 such as a bolt via a synthetic resin 3 such as rubber and the like as shown in FIG. 6. Since it is necessary to realize complete tight closing, this coupling is constructed so as to be able to attain the purpose sufficiently.

Next, an example in which a coupling type clean space apparatus of this invention is applied for a production line of a semiconductor apparatus is explained.

Figure 7:
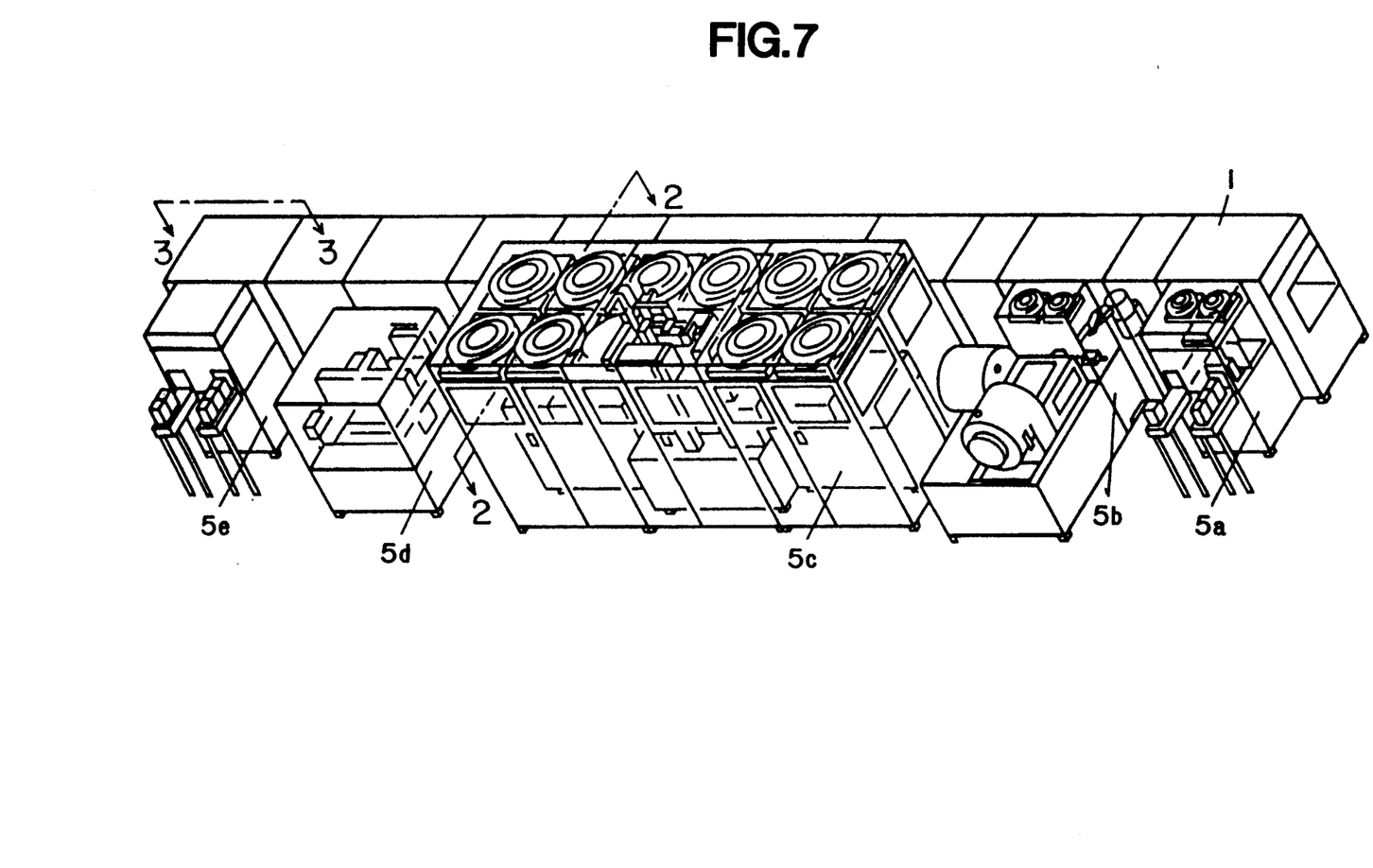
FIG. 7 is an exterior appearance perspective view of a coupling type clean space apparatus which has realized the production line of a semiconductor apparatus.
Figure 8:
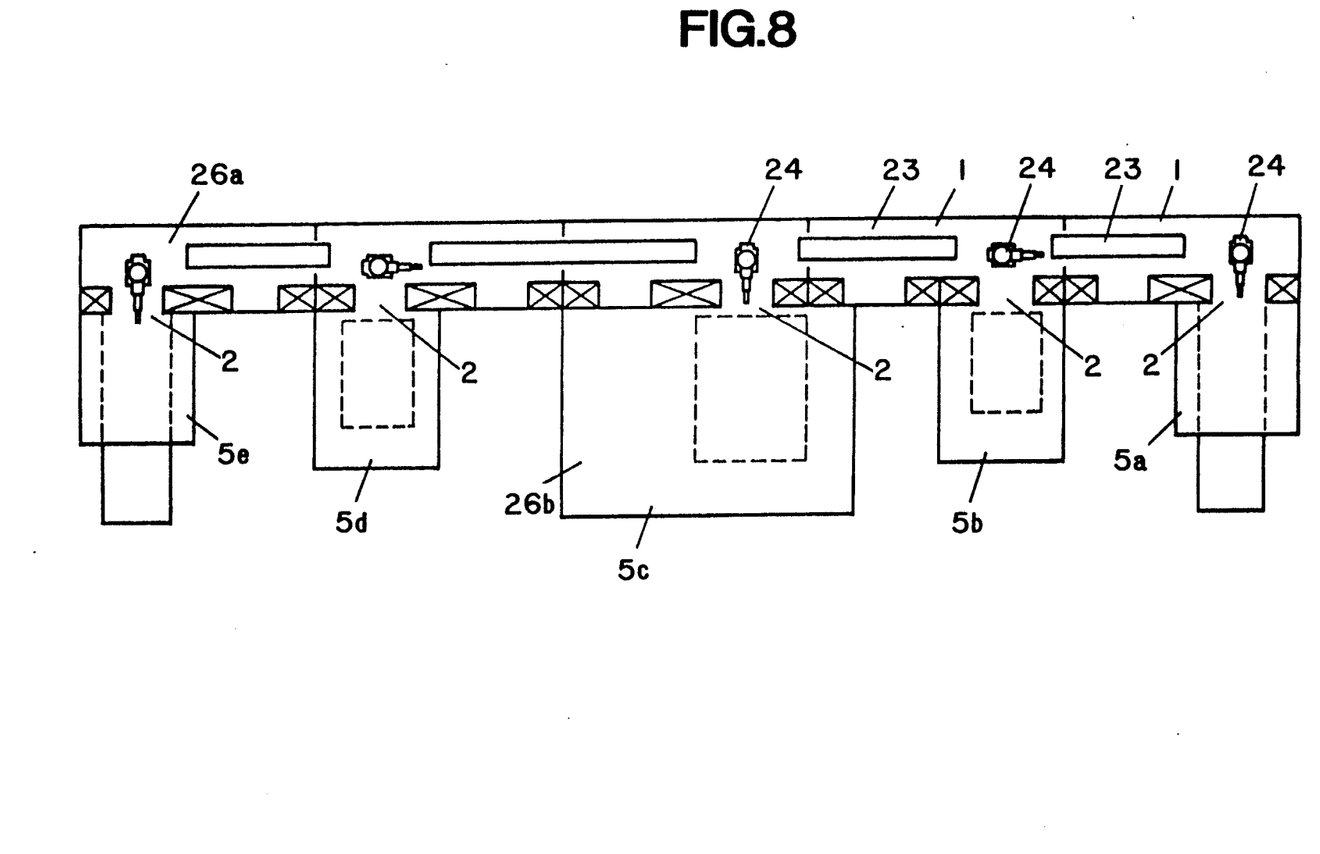
FIG. 8 is a ground plan of an apparatus in FIG. 7.

FIG. 7 is an exterior appearance perspective view of a coupling type clean space apparatus which has realized the production line of a semiconductor apparatus and, FIG. 8 is a ground plan of the same apparatus. In the FIGS. 5a denotes a supplying module in which a supplying and transporting means are arranged to supply an article to be processed for a line in a clean space system, 5b denotes a sputter module in which a sputtering apparatus is arranged, 5c denotes a photolithomodule in which a photolithographic processing apparatus is arranged, 5d denotes an etching module in which an etching process apparatus is arranged, and 5e denotes a module to take out, in which a transporting means to take out an articles to be processed after these various processing being carried out in sequence is arranged. These modules are arranged in the above-mentioned order, as shown in the figures.

Hereinafter, a proceeding of the whole production line of a semiconductor apparatus is explained referring figures.

An article to be processed is transported into a processing space 26a, that is a clean space, by a supplying and transporting means arranged in the supplying module 5a.

The supplying module 5a and the module to take out 5e is made so as not to pollute clean surroundings during the transportation. That is, a clarifying space equipped with a common air-shower is arranged between the exterior air and a clean space interposing shutting facilities such as a shutter etc., and therefore, when an article to be processed is put in and taken out from a clean space, this article movement is always carried out via the clarifying space, so that direct invasion of the exterior air into a clean space does not occur.

An article to be processed which has been brought into the processing space 26, that is a clean space, is placed on the transporting means 23 by the working robot 24 arranged in the processing space 26. The clean work robot 24 is a robot which is made so as not to pollute clean surroundings, and it is arranged at a position of the opening 2, where each of modules (5a to 5e) constructing the unit room body for work 5 is coupled with the unit room body 1.

The article to be processed, which is placed on the transporting means 23, is transported to the opening 2 position where the unit room body 1 is coupled with the sputter module 5b, that is the unit room body for operation 5.

Figure 9:
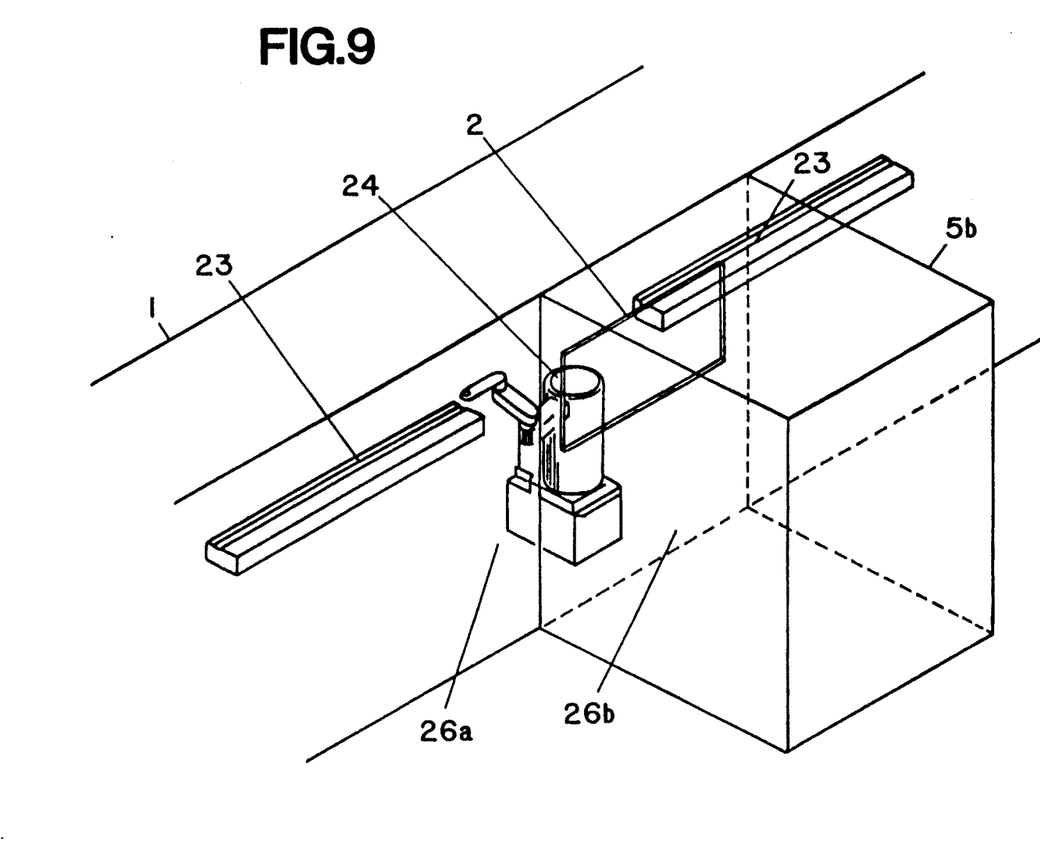
FIG. 9 shows a detailed perspective view of internal appearance of one part of the clean space apparatus in FIG. 7.
Figure 10:
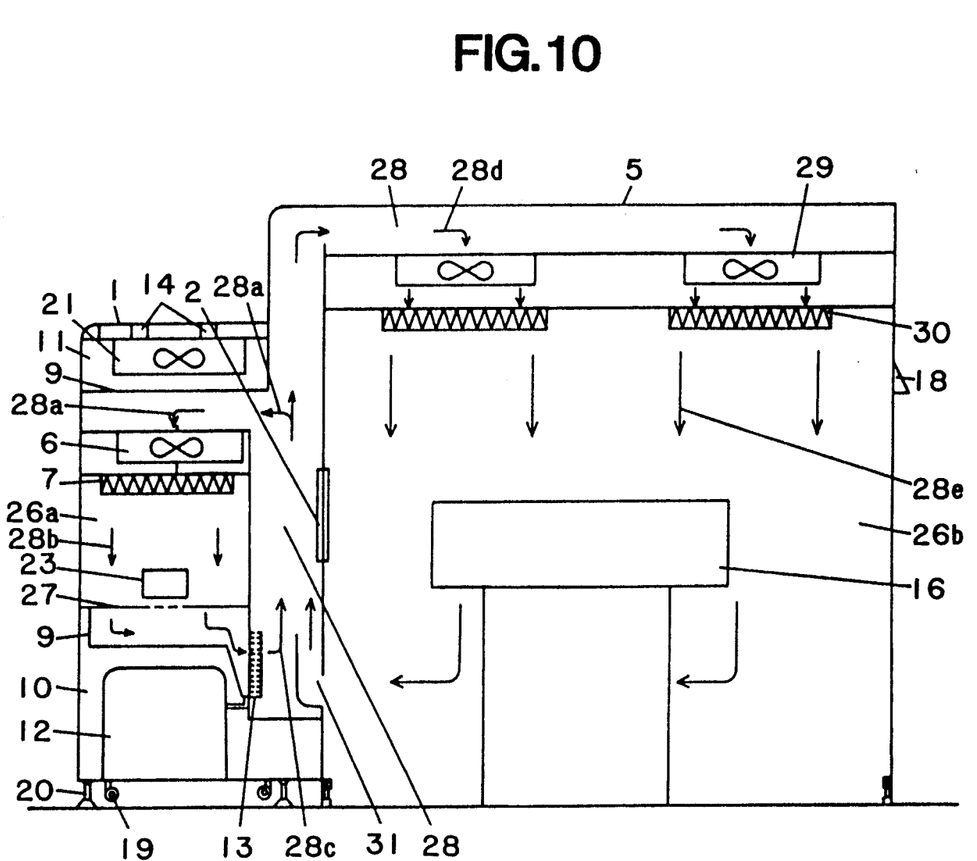
FIG. 10 is a cross-sectional view showing a 2—2 arrow-indicated section in FIG. 7.
Figure 11:
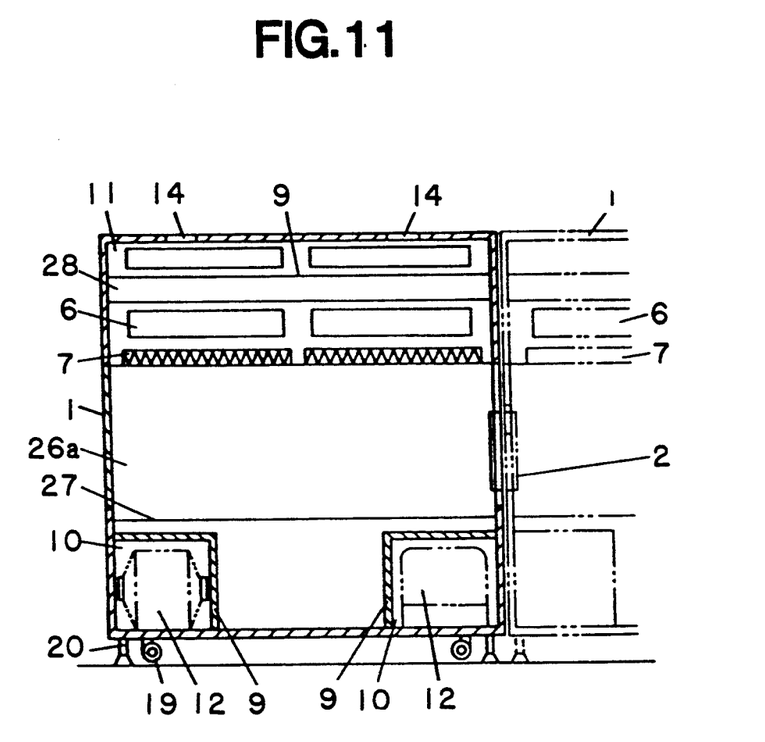
FIG. 11 is a cross-sectional view showing a 3—3 arrow-indicated section in FIG. 7.

FIG. 9 is a view showing delivery and receiving of an article to be processed, which are carried out between the unit room body 1 and the unit room body for operation 5 by the clean work robot 24. FIGS. 10 and 11 are cross-sectional views of an 2—2 arrow-indicated and a 3—3 arrow-indicated sections in FIG. 7. The structure of unit room body 1 shown in FIGS. 10 and 11 is similar to that of the unit room body 1 shown in FIG. 3 and, explanation is omitted by putting identical marks on the figures.

As shown in FIG. 9, the article to be processed, which has been transported to the opening 2 position by the transporting means 23, is further transported by the working robot 24 from the processing space 26a of the unit room body 1 to the processing space 26b of the sputter module 5b through the opening 2.

The article to be processed, which has been transported into the processing space 26b, is further transported by the clean work robot 24, after being subjected (with a sputtering process) by a sputtering apparatus that is a processing apparatus 16, to the transporting means 23 through the opening 2.

Then, after transporting and various processing are carried out similarly to the aforementioned, the article to be processed is taken out from the module to take out 5e and thus, a series of processing finishes.

Next, the structure of the unit room body 5 for operation is explained referring to FIG. 10.

In the unit room body 5 used for operation, reference numeral 29 air-circulator arranged near a ceiling in the processing space 26b, which is similar to that arranged in the unit room body 1. Reference numeral 18 is a minute pressure difference damper, by which a minute amount of air runs out to an exterior to control pressure.

Meanwhile, in a case where air-conditioning is necessary for processing in the unit room body 5 for operation, the unit room body 1 is coupled with the unit room body 5. The unit room body 1 is equipped with the air-conditioner 12 as well as the air conditioner-setting spaces 10 and 11 and, on the other hand, in a case where an air-conditioning is not especially required for processing in the unit room body 5, the unit room body 1 is coupled with a unit room body 5 which is equipped with air-conditioning spaces 10 and 11, but not with an air-conditioner 12, or it is coupled with a unit room body 5 not equipped with air-conditioning spaces 10 and 11 as well as an air-conditioner 12. FIG. 10 shows an application example of these cases.

That is, the unit room body 5 shown in FIG. 10 has only the air-circulator 29 and dust catcher 30, but not the air-conditioner 12 as well as the air conditioner-setting space 10 and 11, and also, it has construction from which an air current path through which air runs from a low side to above is removed and in which the air current path 28 of the unit room body 1 is in a joint use. With this construction, since there is no space for setting an air-conditioner and no space being occupied by the air current path through which air runs from a low side to above, a processing space in the unit room body 5 for operation can be secured at a maximum.

In particular, when a large type processing apparatus like the production line of a semiconductor apparatus in the present example is required, this construction is very effective.

Hereinafter, an action to maintain clean surroundings of a coupling type clean space apparatus made by the above-described construction is explained referring to FIG. 10. In FIG. 10, the air-circulator 6 inhales air from the air current path 28 at a side of an interior of the unit room body 1 (28a) and exhales as a uniform air current to the processing space 26a on a lower side (28b). At this occasion, the air passes through a fan unit, which is a dust catcher 7, so that clarified air is always supplied for the processing space 26a.

The air supplied is inhaled into a duct having many holes that is a floor of the processing space 26a, reaches the heat-exchanging device 13, is adjusted at a proper temperature by the air-conditioner 12, runs into the air current path 28 (28c). Here, the amount of heat exchanged by the device 13 is discharged from the ventilator 14 by the exhausting means 21.

A part of the air run into the air current path 28 is supplied again for the processing space 26a by the air-circulator 6 (28a), but a residual part is supplied for a processing space 26b of the unit room body for operation 5 (28d).

The air-circulator 29 and dust catcher 30 similar to those in the unit room body 1 are arranged in the unit room body for operation 5, so that clarified air is always supplied by the above 29 and 30 for the processing space 26b (28e). Thus, the supplied air runs into the air current path 28 through the inhaling opening 31 and thus, the aforementioned air circulation is repeated.

Thus, since there are arranged the air-conditioner 6 and dust catcher 7 in each of the unit room bodies constructing a clean space, even if the coupling number or the arrangement of the unit room bodies is altered, it is possible to realize clean surroundings in each of the unit room bodies.

What is claimed are:

1. A plurality of self-contained, independently operable clean room bodies, each body comprising:
    wall means for forming a sealable enclosure and having opening means for selectively coupling one of said plurality of clean room bodies to a different one of said plurality of clean room bodies so that a common clean room space within said one clean room body and said different clean room body is formed;
    a first partition means within the enclosure defining an air conditioner setting space therein;
    a second partition means within the enclosure defining a clean space portion therein that is shut off from said air conditioner-setting space;
    an air circulator; and
    a dust catcher,
    wherein at least one of the plurality of bodies further comprises an air conditioner set in the respective air conditioner-setting space of the one body.

2. A plurality of self-contained independently operable clean room bodies according to claim 1, in which said opening means for selectively coupling includes two terminals, each of said terminals having a terminal opening, wherein the clean space is formed by coupling together the terminals of at least two of said bodies.

3. A plurality of self-contained independently operable clean room bodies according to claim 1, in which one of said bodies has an additional opening for penetrating the clean space portion in said one body, and said apparatus includes a further body which has a further opening, wherein said further opening is coupled to the additional opening.

4. A plurality of self-contained independently operable clean room bodies according to any one of claim 1, 2, or 3, in which each of said plurality of bodies further comprises an air-conditioner set in the air conditioner-setting space.

5. A plurality of self-contained independently operable clean room bodies according to claim 1, in which the first partition means of each respective body is removeable.

6. A plurality of self-contained independently operable clean room bodies according to claim 1, in which:
    a first one of said plurality of bodies includes an air-conditioner and a third partition means defining an air current path through which air runs upward, the air current path being located within the enclosure of the first body.
    wherein said first body is coupled with a second one of said plurality of bodies, so that conditioned air from said air current path of said first body is provided to the clean space portion in the first body and the clean space portion in the second body.

7. A plurality of self-contained, independently operable clean room bodies, each body comprising:
    wall means for forming a sealable enclosure and having opening means for selectively coupling one of said plurality of clean room bodies to a different one of said plurality of clean room bodies so that a common clean room space within said one clean room body and said different clean room body is formed,
    removeable partition means mounted to the wall means within the enclosure to define an air conditioner setting space and a clean space portion that is isolated from the air conditioner-setting space when the partition means is attached to the wall means, the air conditioner-setting space being joined with the clean space portion when the partition means is removed from the wall means,
    an air circulator, and
    a dust catcher;
    wherein a first one of the plurality of bodies includes an air-conditioner set in the air conditioner-setting space of the first body,
    the partition means of a second one of the plurality of bodies is removed to join the respective air conditioner-setting space and clean space portion of the second body, and
    the first body is coupled with a second one of the plurality of bodies, so that conditioned air from the first body is provided to the clean space portion in the first body and the clean space portion in the second body.

* * * * *